United States Patent
Marsh et al.

(10) Patent No.: US 8,225,745 B2
(45) Date of Patent: Jul. 24, 2012

(54) CHEMICAL VAPORIZER FOR MATERIAL DEPOSITION SYSTEMS AND ASSOCIATED METHODS

(75) Inventors: Eugene P. Marsh, Boise, ID (US); David R. Atwell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/019,885

(22) Filed: Feb. 2, 2011

(65) Prior Publication Data

US 2011/0124201 A1 May 26, 2011

Related U.S. Application Data

(62) Division of application No. 11/830,688, filed on Jul. 30, 2007, now Pat. No. 7,883,745.

(51) Int. Cl.
| | |
|---|---|
| C23C 16/448 | (2006.01) |
| C23C 16/52 | (2006.01) |
| C23F 1/00 | (2006.01) |
| H01L 21/306 | (2006.01) |
| G05B 15/00 | (2006.01) |
| B05D 7/22 | (2006.01) |
| B05D 5/00 | (2006.01) |
| C23C 16/06 | (2006.01) |
| C23C 16/22 | (2006.01) |

(52) U.S. Cl. .......... 118/723 VE; 118/663; 118/688; 118/695; 118/696; 118/697; 118/698; 118/699; 118/700; 427/96.8; 427/237; 427/248.1; 427/255.23; 700/266; 700/268; 700/269; 700/271; 156/345.1

(58) Field of Classification Search .......... 118/723 VE, 118/663–704; 700/266, 268, 269, 271, 274; 222/3; 156/345.1; 427/96.8, 237, 248.1, 427/255.23
See application file for complete search history.

(56) References Cited

U.S. PATENT DOCUMENTS

| | | | |
|---|---|---|---|
| 4,584,206 A | | 4/1986 | Sleighter |
| 4,683,143 A | * | 7/1987 | Riley .............................. 427/8 |
| 5,173,152 A | * | 12/1992 | Tanaka ........................... 216/79 |
| 5,372,754 A | * | 12/1994 | Ono ............................... 261/142 |
| 5,376,409 A | | 12/1994 | Kaloyeros et al. |
| 5,531,188 A | | 7/1996 | Tomasulo |
| 5,648,175 A | * | 7/1997 | Russell et al. ............. 428/472.3 |
| 5,670,218 A | * | 9/1997 | Baek ............................ 427/576 |
| 5,690,743 A | * | 11/1997 | Murakami et al. ........... 118/715 |
| 5,693,377 A | * | 12/1997 | Westmoreland et al. ..... 427/582 |
| 5,730,804 A | * | 3/1998 | Gomi et al. .................. 118/726 |
| 5,834,314 A | * | 11/1998 | Gates et al. .................... 436/52 |
| 5,943,230 A | * | 8/1999 | Rinnen et al. .................. 700/18 |

(Continued)

FOREIGN PATENT DOCUMENTS

| | | |
|---|---|---|
| EP | 0551847 A1 | 7/1993 |
| JP | 2003017462 A | 1/2003 |

*Primary Examiner* — Rudy Zervigon

(74) *Attorney, Agent, or Firm* — Perkins Coie LLP

(57) ABSTRACT

System and method for operating a material deposition system are disclosed. In one embodiment, the method can include periodically injecting a precursor into a vaporizer through an injector at the vaporizer, vaporizing the precursor in the vaporizer and supplying the vaporized precursor to a reaction chamber in fluid communication with the vaporizer, and shutting down the vaporizer and the reaction chamber after a period of time. The method can also include conducting maintenance of the injector at the vaporizer by using a vapor solvent rinse.

12 Claims, 4 Drawing Sheets

U.S. PATENT DOCUMENTS

| | | | | |
|---|---|---|---|---|
| 5,966,499 | A * | 10/1999 | Hinkle et al. | 392/388 |
| 5,997,588 | A * | 12/1999 | Goodwin et al. | 29/25.01 |
| 6,077,356 | A * | 6/2000 | Bouchard | 118/715 |
| 6,132,515 | A * | 10/2000 | Gauthier | 118/715 |
| 6,136,725 | A * | 10/2000 | Loan et al. | 438/758 |
| 6,159,345 | A | 12/2000 | Donnelly et al. | |
| 6,178,925 | B1 * | 1/2001 | Sturm et al. | 122/390 |
| 6,216,708 | B1 * | 4/2001 | Agarwal | 134/1.1 |
| 6,224,681 | B1 * | 5/2001 | Sivaramakrishnan et al. | 118/726 |
| 6,258,171 | B1 * | 7/2001 | Agarwal | 118/715 |
| 6,296,711 | B1 * | 10/2001 | Loan et al. | 118/726 |
| 6,338,759 | B1 * | 1/2002 | Yu et al. | 118/726 |
| 6,352,593 | B1 * | 3/2002 | Brors et al. | 118/724 |
| 6,432,205 | B1 * | 8/2002 | Lee et al. | 118/715 |
| 6,475,902 | B1 * | 11/2002 | Hausmann et al. | 438/627 |
| 6,511,718 | B1 * | 1/2003 | Paz de Araujo et al. | 427/576 |
| 6,534,133 | B1 * | 3/2003 | Kaloyeros et al. | 427/576 |
| 6,581,625 | B1 * | 6/2003 | Arai et al. | 137/240 |
| 6,638,346 | B1 | 10/2003 | Magni et al. | |
| 6,663,716 | B2 * | 12/2003 | Loan et al. | 118/726 |
| 6,715,507 | B2 * | 4/2004 | Arai et al. | 137/240 |
| 6,743,473 | B1 * | 6/2004 | Parkhe et al. | 427/252 |
| 6,855,929 | B2 * | 2/2005 | Kimba et al. | 850/9 |
| 6,868,869 | B2 * | 3/2005 | Olander | 137/888 |
| 6,926,774 | B2 * | 8/2005 | Yoshidome et al. | 118/726 |
| 7,007,933 | B2 * | 3/2006 | Lee et al. | 261/121.1 |
| 7,011,710 | B2 * | 3/2006 | Bang et al. | 118/715 |
| 7,323,220 | B2 * | 1/2008 | Kojima et al. | 427/250 |
| 7,439,502 | B2 * | 10/2008 | Nakasuji et al. | 250/306 |
| 7,452,424 | B2 * | 11/2008 | Okabe et al. | 118/726 |
| 7,485,338 | B2 * | 2/2009 | Faguet | 427/248.1 |
| 7,560,793 | B2 * | 7/2009 | Derderian et al. | 257/506 |
| 7,638,161 | B2 * | 12/2009 | Mukai et al. | 427/96.8 |
| 7,673,856 | B2 * | 3/2010 | Toda et al. | 261/78.2 |
| 7,781,016 | B2 * | 8/2010 | Stevens et al. | 427/248.1 |
| 7,827,932 | B2 * | 11/2010 | Kojima et al. | 118/723 VE |
| 7,883,076 | B2 * | 2/2011 | Okabe et al. | 261/142 |
| 7,883,745 | B2 * | 2/2011 | Marsh et al. | 427/248.1 |
| 8,026,159 | B2 * | 9/2011 | Horii et al. | 438/500 |
| 8,114,479 | B2 * | 2/2012 | Spohn et al. | 427/255.28 |
| 2001/0022272 | A1 * | 9/2001 | Plester et al. | 204/192.38 |
| 2002/0017246 | A1 * | 2/2002 | Kojima et al. | 118/726 |
| 2002/0022087 | A1 * | 2/2002 | Satake et al. | 427/255.28 |
| 2003/0017610 | A1 | 1/2003 | Gerstel | |
| 2004/0121074 | A1 * | 6/2004 | Zhuang et al. | 427/255.32 |
| 2005/0011444 | A1 * | 1/2005 | Lee et al. | 118/715 |
| 2005/0092250 | A1 * | 5/2005 | Kojima et al. | 118/715 |
| 2005/0137241 | A1 | 6/2005 | Kenda et al. | |
| 2006/0008595 | A1 * | 1/2006 | Ishizaka et al. | 427/569 |
| 2006/0065254 | A1 * | 3/2006 | Okabe et al. | 123/557 |
| 2007/0059447 | A1 | 3/2007 | Kim et al. | |
| 2007/0079760 | A1 * | 4/2007 | Okabe et al. | 118/715 |
| 2007/0108641 | A1 * | 5/2007 | Okabe et al. | 261/118 |
| 2007/0266941 | A1 * | 11/2007 | Marsh et al. | 118/715 |
| 2008/0009977 | A1 * | 1/2008 | Krishnan et al. | 700/266 |
| 2008/0044573 | A1 * | 2/2008 | Chen et al. | 427/255.28 |
| 2008/0121184 | A1 * | 5/2008 | Choi et al. | 118/733 |
| 2008/0245306 | A1 * | 10/2008 | Nakao et al. | 118/726 |
| 2009/0035465 | A1 * | 2/2009 | Marsh et al. | 427/255.28 |
| 2009/0061648 | A1 * | 3/2009 | Horii et al. | 438/778 |
| 2009/0064688 | A1 * | 3/2009 | Dendy et al. | 62/50.2 |
| 2009/0064931 | A1 * | 3/2009 | Horii et al. | 118/708 |
| 2009/0107402 | A1 * | 4/2009 | Nam et al. | 118/726 |
| 2009/0186479 | A1 * | 7/2009 | Okabe et al. | 438/680 |
| 2009/0238968 | A1 * | 9/2009 | Hatanaka et al. | 427/237 |
| 2009/0269494 | A1 * | 10/2009 | Takahashi et al. | 427/255.28 |
| 2010/0186673 | A1 * | 7/2010 | Tanaka et al. | 118/726 |
| 2010/0219157 | A1 * | 9/2010 | Matsumoto | 216/37 |
| 2010/0291763 | A1 * | 11/2010 | Ogawa et al. | 438/584 |
| 2011/0003482 | A1 * | 1/2011 | Ogawa et al. | 438/763 |
| 2011/0008955 | A1 * | 1/2011 | Horii et al. | 438/608 |
| 2011/0033956 | A1 * | 2/2011 | Sakai | 438/5 |
| 2011/0049718 | A1 * | 3/2011 | Matsumoto et al. | 257/751 |
| 2011/0124201 | A1 * | 5/2011 | Marsh et al. | 438/758 |
| 2011/0171383 | A1 * | 7/2011 | Woelk et al. | 427/255.23 |
| 2011/0197812 | A1 * | 8/2011 | Im et al. | 118/696 |
| 2011/0300695 | A1 * | 12/2011 | Horii et al. | 438/507 |
| 2012/0040085 | A1 * | 2/2012 | Kojima et al. | 427/58 |

* cited by examiner

CHEMICAL VAPORIZER FOR MATERIAL DEPOSITION SYSTEMS AND ASSOCIATED METHODS

CROSS-REFERENCE TO RELATED APPLICATION

This application is a divisional of U.S. application Ser. No. 11/830,688 filed Jul. 30, 2007, now U.S. Pat. No. 7,883,745, which is incorporated herein by reference in its entirety.

TECHNICAL FIELD

The present disclosure is related to material deposition systems for performing chemical vapor deposition processes, including continuous vapor deposition and/or pulsed vapor deposition (e.g., atomic layer deposition processes.)

BACKGROUND

In manufacturing integrated circuits, various thin films are deposited and patterned on a semiconductor substrate. One deposition process is continuous chemical vapor deposition (CVD). In a continuous CVD process, a gaseous precursor is delivered to a reaction chamber to contact a heated substrate, e.g., a semiconductor workpiece. The precursor then dissociates in a chemical reaction to coat the substrate with a layer of deposited material. Another deposition process is pulsed CVD, which includes delivering one or more gas precursors in pulses. Atomic layer deposition (ALD) is one pulsed CVD process. In an ALD process, a layer of first chemical forms on a substrate surface and self limits to a monolayer. The first chemical is then purged from the system. A second chemical is then introduced to react with the first chemical and is then purged from the system. This process can be repeated until a layer of the desired thickness is deposited onto the substrate.

In both continuous CVD and ALD processes, the precursor must be delivered in a gaseous state. Many potentially useful precursors have relatively high vaporization temperatures, and these precursors must be heated in a vaporizer before being delivered to the reaction chamber. However, such heating can adversely affect certain precursors. For example, some precursors can decompose at elevated temperatures and contaminate and/or clog the vaporizer and/or other components of a deposition system. The deposition system typically must be shut down for clogged or contaminated lines, which can reduce product throughput and increase manufacturing cost. Therefore, there is a need for efficiently and cost-effectively maintain the vaporizer.

DETAILED DESCRIPTION

Specific details of several embodiments of the disclosure are described below with reference to a material deposition system and methods for supplying a gaseous precursor to the material deposition system. Several other embodiments of the material deposition system may have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1-4.

Even though embodiments of the material deposition system are discussed below primarily in the context of chemical vapor deposition such as atomic layer deposition, aspects of the invention may be useful in any thin film deposition or etching technique requiring a source of gaseous precursors. Such techniques may include, for example, metal organic chemical vapor deposition, atmospheric pressure vapor deposition, low pressure chemical vapor deposition, plasma enhanced low pressure vapor deposition, atomic layer deposition, and molecular beam epitaxy. Likewise, the following discussion focuses primarily on methods and apparatus for processing semiconductor workpieces, but in certain embodiments, the substrate may comprise silicon, gallium arsenide, glass, an insulating material such as sapphire, or any other substrate material upon which thin films may be deposited.

Figure 1:
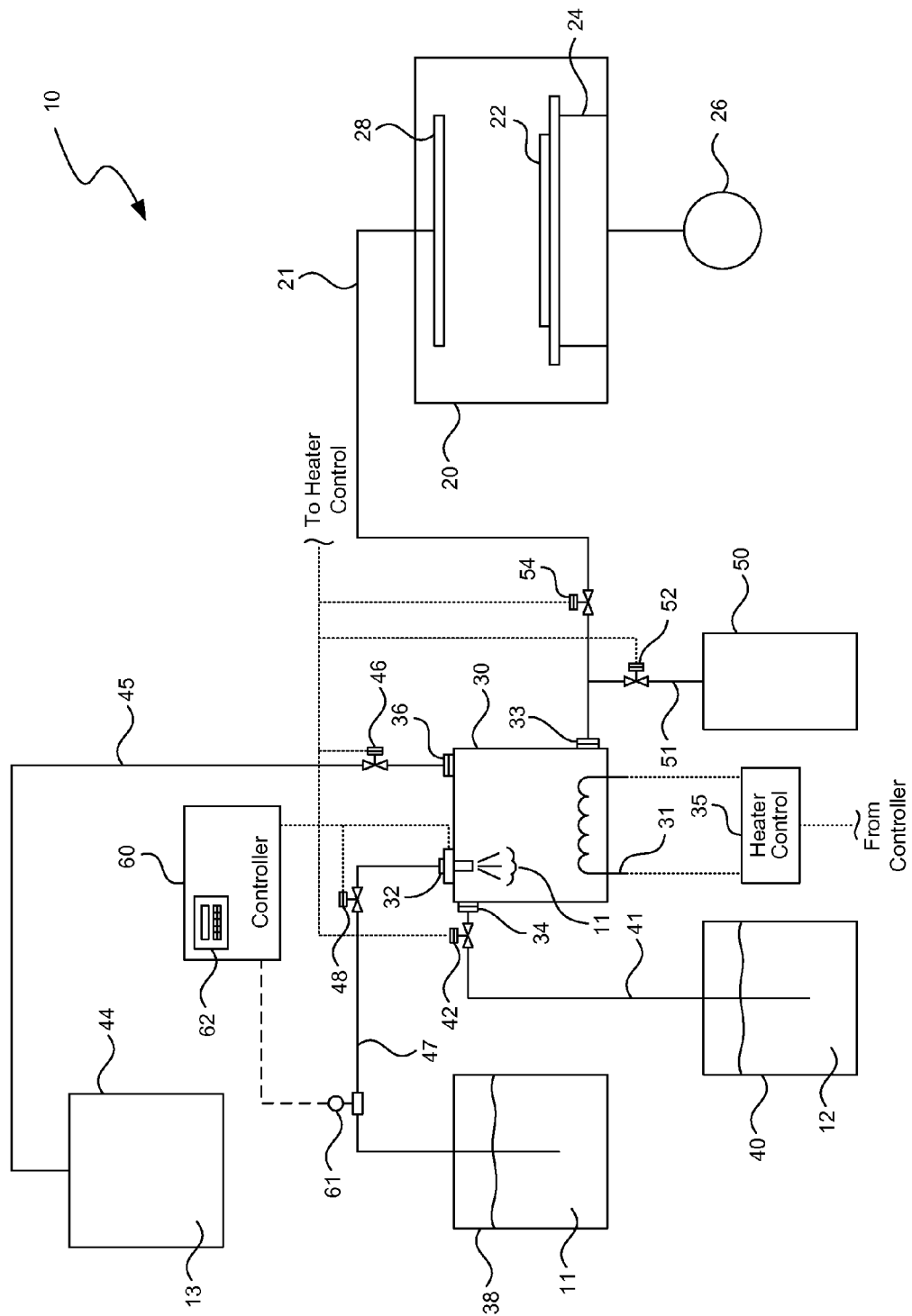
FIG. 1 is a schematic diagram of a material deposition system during normal operation in accordance with an embodiment of the disclosure.

FIG. 1 is a schematic diagram of a material deposition system 10 during normal operation in accordance with an embodiment of the disclosure. The system 10 can include a reaction chamber 20, a vaporizer 30 for vaporizing a precursor 11, and a delivery line 21 connecting the vaporizer 30 to the reaction chamber 20 for supplying the vaporized precursor 11 to the reaction chamber 20. The precursor 11 can contain trischlorodiethylamino titanium (TCDEAT), bis-ditertbutyl-diketimide strontium (SDBK), and/or other suitable chemical compounds. The system 10 can also include a chamber inlet valve 54 in the delivery line 21 to regulate a precursor flow to the reaction chamber 20.

The reaction chamber 20 can include a heating plate 24 to support and/or heat a semiconductor workpiece 22. The heating plate 24 can maintain the workpiece 22 at a relatively constant elevated temperature (e.g., about 100°-700° C.) during a CVD process. The heating plate 24 can include electrical resistance, thermoelectric, and/or other types of suitable heating elements. In some embodiments, the reaction chamber 20 can also include a gas distributor 28 adjacent to the semiconductor workpiece 22. The gas distributor 28 can control uniformity and/or the flow rate of the precursor 11. In certain embodiments, the system 10 can also include an optional vacuum pump 26 connected to the reaction chamber 20 for maintaining the reaction chamber 20 at a reduced pressure, e.g., between about $10^{-7}$ torr and about 700 torr.

The vaporizer 30 can be a glass, quartz, and/or metal vessel having a carrier gas port 36, a solvent port 34, and an outlet port 33. The vaporizer 30 can include an injector 32 for injecting the precursor 11 into the vaporizer 30. In one embodiment, the injector 32 can be generally similar to fuel injectors used in automobiles (e.g., solenoid injectors). The injector 32 can be programmed to allow a desired amount of precursor 11 to enter the vaporizer 30 at predetermined time intervals. The vaporizer 30 can also include a heater 31 for supplying energy to vaporize the injected precursor 11. The heater 31 can be a clam-shell external heater, an external radiation heater, an internal resistive heater, or other types of internal or external heating devices. The vaporizer 30 can also include a heater control 35 electrically coupled to the heater 31 for monitoring and/or regulating the operation of the heater 31.

The system 10 can also include a precursor storage 38 holding the precursor 11, a precursor supply line 47 between the precursor storage 38 and the injector 32, and a precursor supply valve 48 in the precursor supply line 47 for regulating a precursor flow to the vaporizer 30. The precursor storage 38 can be a tank constructed with glass, plastic, or other suitable material compatible with the precursor 11. In some embodiments, the precursor storage 38 can be blanketed and/or pressurized with argon, nitrogen, or other suitable inert gas. In other embodiments, the precursor storage 38 can be open to the atmosphere.

The system 10 can further include a solvent storage 40 holding a solvent 12, a solvent line 41 between the solvent storage 40 and the solvent port 34, and a solvent inlet valve 42 in the solvent line 41. The solvent 12 can be isopropanol, tetrahyrafuran, hexane, octane, other suitable solvents, or a mixture of the foregoing compounds. Optionally, the system 10 can further include a waste storage 50 for collecting used solvent from the vaporizer 30, a waste line 51 between the waste storage 50 and the vaporizer 30, and a dump valve 52 in the waste line 51.

In the illustrated embodiment, the system 10 also includes an optional carrier gas storage 44 holding a carrier gas 13, a carrier gas line 45 between the carrier gas storage 44 and the carrier gas port 36, and a carrier gas valve 46 in the carrier gas line 45. The carrier gas storage 44 can be a pressurized tank holding argon, nitrogen, and/or other suitable carrier gas 13 that can facilitate the transport of the vaporized precursor 11 to the reaction chamber 20. In other embodiments, the carrier gas storage 44, the carrier gas line 45, and the carrier gas valve 46 can be omitted.

The system 10 can further include a controller 60 in electrical communication (showing in phantom lines for clarity) with the injector 32, the precursor supply valve 48, the carrier gas valve 46, the solvent inlet valve 42, the dump valve 52, the chamber inlet valve 54, and the heater control 35. The controller 60 can include a Programmable Logic Controller (PLC), a Distributed Control System (DCS), a System Logic Controller (SLC), a personal computer, and/or other suitable logic processor. The controller 60 can include a computer-readable medium containing instructions for controlling the operation and maintenance of the system 10, as described in more detail below with reference to FIG. 3. In the illustrated embodiment, the controller 60 optionally includes an operator panel 62 for providing process information to an operator and/or receiving input from the operator. In other embodiments, the operator panel 62 can be omitted.

During processing, the controller 60 can command the heater control 35 to supply power to the heater 31 to heat and/or maintain the vaporizer 30 at a desired operating temperature (e.g., 80° C.). Then, the controller 60 can transmit an electrical signal to the precursor supply valve 48. In response, the precursor supply valve 48 opens to provide a flow of the precursor 11 to the injector 32. The controller 60 can then periodically actuate the injector 32 for a certain period of time to inject a desired amount of precursor 11 into the vaporizer 30. The injected precursor 11 then vaporizes in the vaporizer 30 by absorbing heat from the heater 31. The controller 60 can then open the chamber inlet valve 54 to supply the vaporized precursor 11 to the reaction chamber 20. In some embodiments, the controller 60 can also open the optional carrier gas valve 46 to introduce the carrier gas 13 into the vaporizer 30. The carrier gas 13 then mixes with the vaporized precursor 11 before the mixture is supplied to the reaction chamber 20.

After a period of processing, the injector 32 can be clogged due to various reasons. For example, the temperature in the vaporizer 30 can cause the precursor 11 to decompose at the injector 32.

In one embodiment, the system 10 can include at least one sensor to determine the period of processing before the injector 32 should be maintained. For example, the system 10 can include a flow sensor 61 (e.g., a mass flow meter) in the precursor supply line 47 to measure a flow rate of the precursor during operation. If the measured flow rate drops below a preset threshold, then the controller can automatically start a maintenance procedure or can issue an alarm to an operator, and the operator can choose whether to start a maintenance procedure. A precursor concentration sensor (not shown) and/or other types of sensor at the vaporizer 30, in the delivery line 21, or at the reaction chamber 20 can also be used to determine the period of processing. In other embodiments, the controller 60 can start a maintenance procedure after processing one, two, or any desired number of semiconductor workpieces in the reaction chamber 20. After performing the maintenance procedure, additional semiconductor workpieces can be processed in the reaction chamber 20. Performing the maintenance procedure in between processing semiconductor workpieces can reduce, or even prevent, the build-up of decomposed precursor residue in the injector 32.

Figure 2:
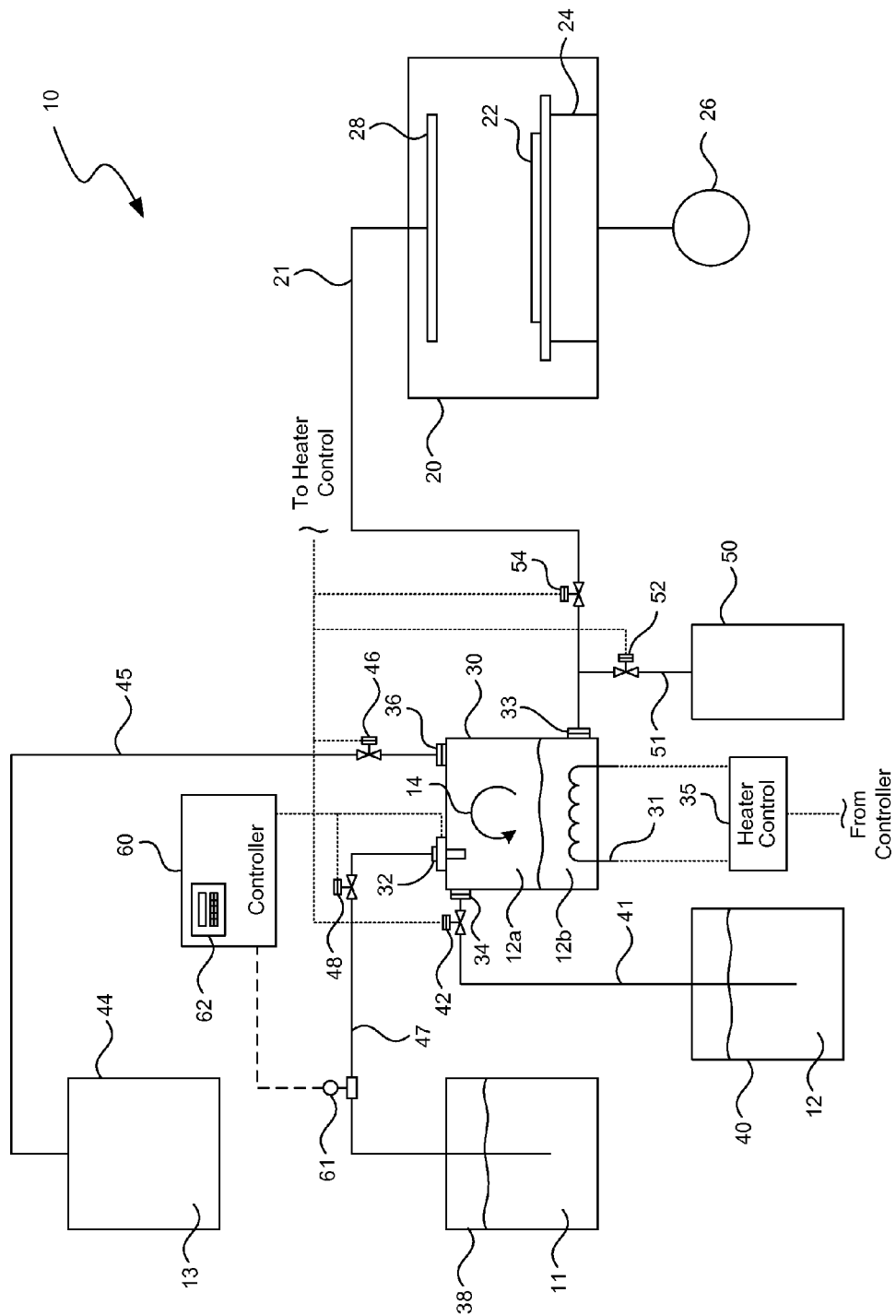
FIG. 2 is a schematic diagram of the material deposition system of FIG. 1 during a maintenance procedure in accordance with an embodiment of the disclosure.

FIG. 2 is a schematic diagram of the material deposition system 10 of FIG. 1 during a maintenance procedure in accordance with an embodiment of the disclosure. To maintain the vaporizer 30, the controller 60 can first stop all material flows into the vaporizer 30 by closing the precursor supply valve 48, the carrier gas valve 46, and the chamber inlet valve 54. The controller 60 can also command the heater control 35 to reach a maintenance temperature. The maintenance temperature can be greater than, less than, or generally similar to the operating temperature of the vaporizer 30. The controller 60 can then open the solvent inlet valve 42 to introduce a sufficient amount of solvent 12 into the vaporizer 30 such that at least a portion of the solvent 12 remains in the liquid phase after being introduced into the vaporizer 30. As a result, the solvent 12 in the vaporizer 30 can include a vapor phase 12a proximate to the injector 32 and a liquid phase 12b spaced apart from the injector 32.

The controller 60 can then close all the valves and maintain the current condition for a certain cleaning period (e.g., five minutes). An operator can adjust the cleaning period based on, for example, a current condition (e.g., color, viscosity, etc.) of the solvent 12 in the vaporizer 30, prior cleaning results, and/or other suitable criteria. At the end of the cleaning period, the controller 60 can open the dump valve 52 to dump the solvent 12 from the vaporizer 30 to the waste storage 50. Then the controller 60 can repeatedly introduce additional solvent 12 into the vaporizer 30 to clean the injector 32 as discussed above until a desired performance in the injector 32 is restored.

The controller 60 can determine the amount of the solvent 12 introduced into the vaporizer 30 using several techniques. For example, the controller 60 can calculate the required amount based on previously gathered empirical data. The controller 60 can also monitor the liquid content of the solvent 12 using a level transmitter, a conductivity transmitter, and/or other instrument at the vaporizer 30. The controller 60 can further accept input from an operator who monitors the liquid content of the solvent 12 in the vaporizer 30 through a sight glass or the vaporizer 30 itself.

The vaporized solvent 12 can effectively and efficiently remove the residue from the injector 32 and vaporizer 30. The applicants have surprisingly discovered that the vapor solvent 12 can remove residue from the injector 32 better than a liquid solvent. Without being bound by theory, it is believed that a solvent reflux 14 in the vaporizer 30 causes such a surprising result. It is believed that the solvent 12 in the vaporizer 30 can first evaporate from the liquid phase 12b, and the evaporated vapor solvent can contact the injector 32 to remove any residue from the injector 32. After contacting the injector 32, the vapor solvent can condense and return to the liquid phase 12b along with any removed residue. The evaporation-condensation process can then be repeated to collect more residue from the injector 32.

Several embodiments of the system 10 can be cost-effective to operate because the injector 32 can be efficiently cleaned. In conventional systems, once the injector 32 is clogged, the system 10 has to be shut down in order to replace the injector 32 and to clean the vaporizer 30. Replacing the injector 32 can increase the production cost and the downtime of the system 10. As a result, by efficiently cleaning the injector 32 without removing the injector 32 from the vaporizer 30, such shutdown, replacement, and cleaning can be avoided, and produce throughput can be increased.

The system 10 can have other configurations in addition to or in lieu of the configuration shown in FIG. 1 and FIG. 2. For example, the system 10 can further include a precursor recirculation pump (not shown) in the precursor supply line 47 and a precursor return line (not shown) between the precursor storage 38 and the injector 32. During operation, the recirculation pump can continuously recirculate the precursor 11 between the precursor storage 38 and the injector 32. Recirculating the precursor 11 can at least reduce the exposure of the precursor 11 to the temperature in the vaporizer 30 and dilute and/or filter, any decomposed precursor.

Figure 3:
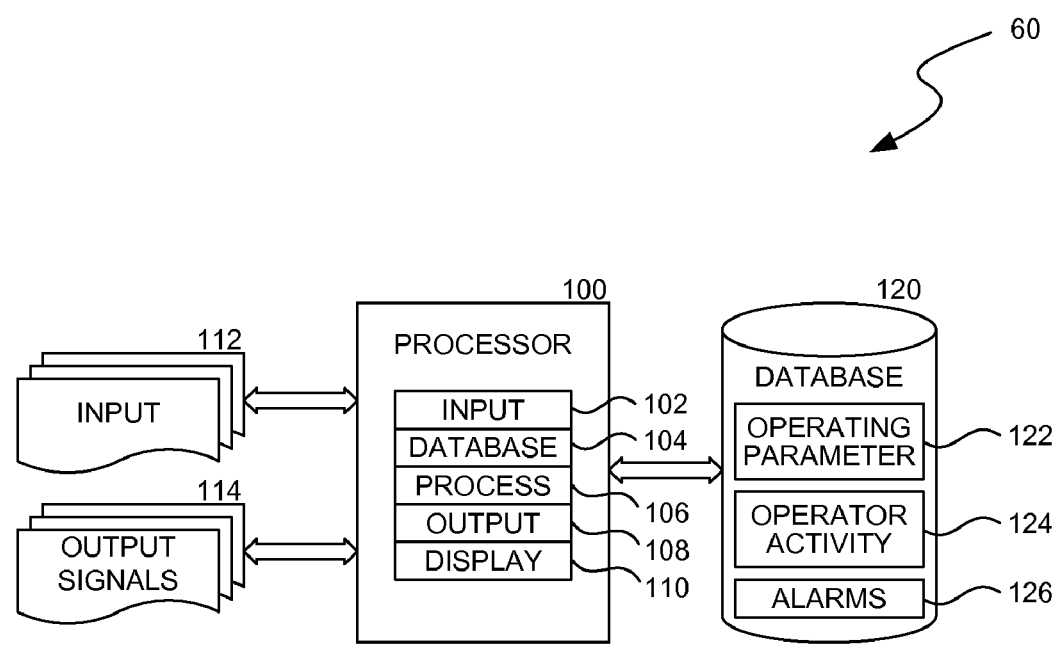
FIG. 3 is a functional diagram illustrating software modules suitable for use in the material deposition system of FIG. 1.

FIG. 3 illustrates a functional diagram showing software modules suitable for use in the controller 60. Each component can be a computer program, procedure, or process written as source code in a conventional programming language, such as the C++ programming language, and can be presented for execution by a processor 100 of the controller 60. The various implementations of the source code and object and byte codes can be stored on a computer-readable storage medium or embodied on a transmission medium in a carrier wave. The modules can include an input module 102, a database module 104, a process module 106, an output module 108, and optionally, a display module 110. In another embodiment, the software modules can be presented for execution by the CPU of a network server in a distributed computing scheme.

In operation, the input module 102 accepts an operator input from an operator via the operator panel 62 and communicates the accepted information or selections to other components for further processing. For example, the input module 102 can accept from the operator the time interval for actuating the injector 32, a temperature setpoint for the heater control 35, and/or other process setpoints. The input module 102 can also accept from the operator selections for entering maintenance mode, starting normal processing, starting/stopping the heater 31, and/or other control selections.

The database module 104 organizes records, including operating parameters 122, operator activities 124, and alarms 126, and facilitates storing and retrieving these records to and from a database 120. Any type of database organization can be utilized, including a flat file system, hierarchical database, relational database, or distributed database, such as provided by a database vendor such as Oracle Corporation, Redwood Shores, Calif.

The process module 106 can generate control signals based on input signals 112, operator input received via the input module 102, and/or internal components (e.g., an internal clock, a sequencer, timers, counters, PID control loops, etc.). For example, the process module 106 can include an internal sequencer (not shown) for carrying out a maintenance procedure. The sequencer can include timers, counters, and other logic components to generate control signals corresponding to individual stages of the maintenance procedure. The process module 106 can also include comparison heuristics for generating alarms 126 that can be stored in the database 120.

The output module 108 can generate output signals 114 based on the control signals from the process module 106. For example, the output module 108 can convert the generated control signals into 4-20 mA output signals 114 suitable for a direct current voltage modulator, or discrete signals for actuating a solenoid valve. The processor 100 can optionally include the display module 110 for displaying, printing, or downloading the input signals 112 and output signals 114 via devices such as the operator panel 62 (FIG. 1). A suitable display module 110 can be a video driver that enables the processor 100 to display the input signals 112 on the operator panel 62.

Figure 4:
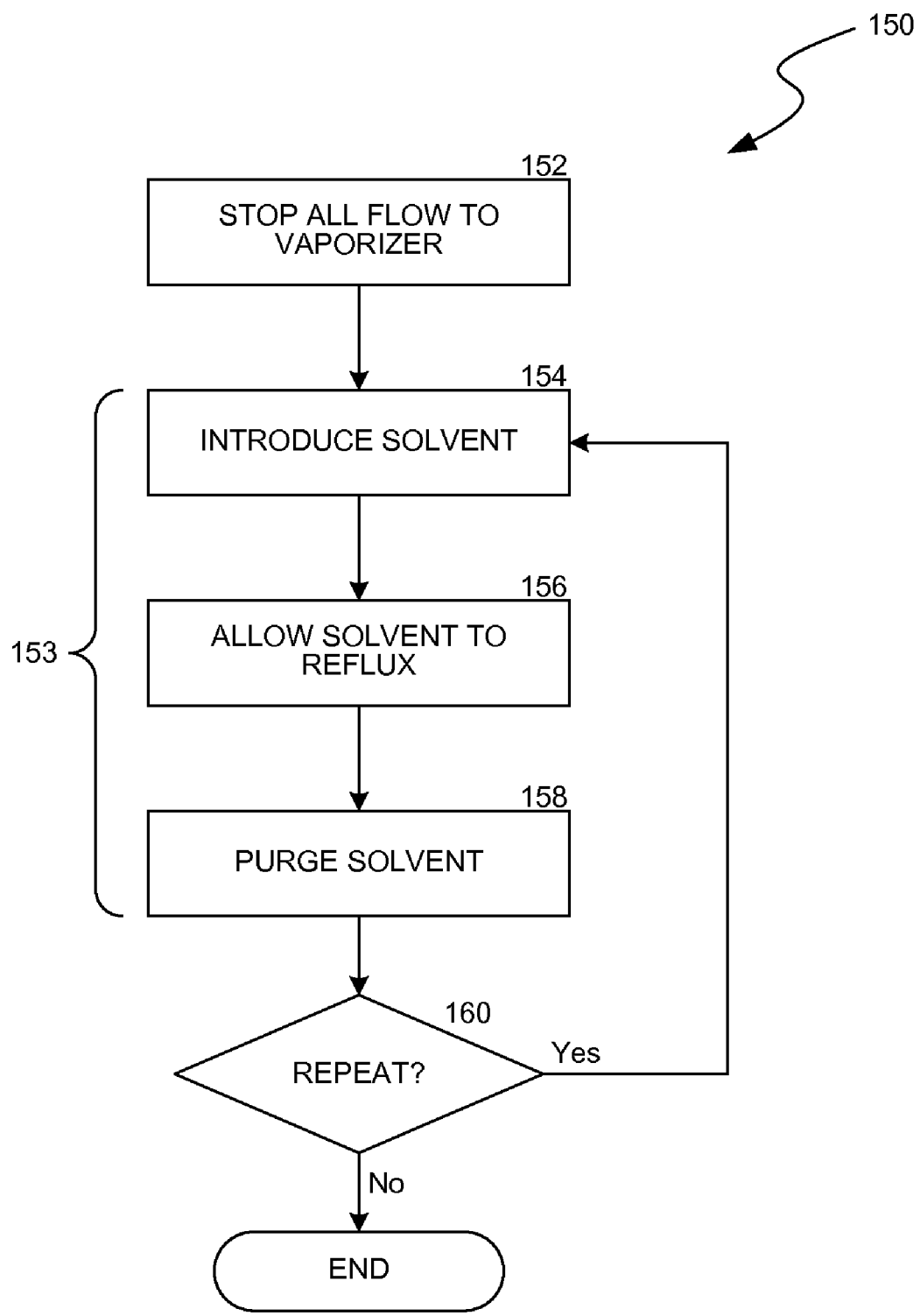
FIG. 4 is a flow chart illustrating a method of cleaning an injector suitable for use in the system of FIG. 1 and FIG. 2.

FIG. 4 is a flow chart illustrating a method 150 of cleaning an injector suitable for use in the system 10 of FIG. 1 and FIG. 2. The method 150 can include stopping all flows to a vaporizer (block 152). For example, valves to the vaporizer can be closed such that no material can enter the vaporizer. The method can also include a solvent cleaning procedure 153 for removing residue from the injector and the vaporizer. The solvent cleaning procedure 153 can include introducing a solvent into the vaporizer such that at least a portion of the introduced solvent remains in the liquid phase (block 154). In one embodiment, excess solvent can be introduced to avoid completely vaporizing the introduced solvent. In other embodiments, the liquid content of the introduced solvent can be monitored and additional solvent can be added to avoid complete vaporization by using, for example, a level transmitter, a sight glass, and/or other instrument operatively coupled to the vaporizer.

The solvent cleaning procedure 153 also includes allowing the introduced solvent to reflux in the vaporizer after the solvent is introduced for a period of time (block 156). An operator can adjust the period for allowing the solvent to reflux based on several process parameters. For example, the operator can adjust the period based on a current condition (e.g., level, color, viscosity, etc.) of the solvent in the vaporizer or based on prior cleaning results.

Without being bound by theory, it is believed that the introduced solvent can reflux in the vaporizer because the solvent liquid is in excess. As a result, at least a portion of the introduced solvent can remain in the liquid phase, and an equilibrium exists between the liquid and vapor phases under the current pressure condition in the vaporizer. Thus, the solvent can evaporate from the liquid phase into the vapor phase to contact the injector before condensing back into the liquid phase. It is believed that contacting the injector with the solvent vapor can dissolve, combine, or otherwise remove residue from the injector as well as the vaporizer body. In some embodiments, such reflux can be enhanced by heating the vaporizer at a first end and cooling it at a second end spaced apart from the first end. For example, the first end can be heated by a heater, and the injector can be cooled by a circulating precursor solution. In other embodiments, other techniques to enhance the solvent reflux can also be used.

The solvent cleaning procedure 153 further includes purging the solvent from the vaporizer after allowing the solvent to reflux for the period of time (block 158). The method 150 further includes a decision block 160 in which a determination is made regarding whether to repeat the solvent cleaning procedure 153. If the answer is no, the process ends. If the answer is yes, the process reverts to block 154. In one embodiment, the determination can be made based on a current condition of the injector after the previous cleaning procedure 153. For example, if the injector performs satisfactorily in a test, then the process can end; otherwise, the solvent cleaning procedure 153 can be repeated. In other embodiments, the determination can be made based on other criteria.

From the foregoing, it will be appreciated that specific embodiments of the invention have been described herein for purposes of illustration, but that various modifications may be made without deviating from the invention. For example, many of the elements of one embodiment may be combined with other embodiments in addition to or in lieu of the elements of the other embodiments. Accordingly, the invention is not limited except as by the appended claims.

We claim:

1. A system for depositing a material onto a semiconductor workpiece, comprising:
    a reaction chamber;
    a vaporizer having an injector;
    a chamber inlet valve through which a vapor flows from the vaporizer to the reaction chamber;
    a precursor supply valve through which a precursor flows to the injector;
    a solvent inlet valve through which a solvent flows to the vaporizer; and
    a controller operably coupled to the injector, the chamber inlet valve, the precursor supply valve, and the solvent inlet valve, the controller having a computer-readable medium containing instructions that cause the controller to perform a method comprising
        closing the chamber inlet valve and the precursor supply valve; and
        thereafter, opening the solvent inlet valve to introduce an amount of the solvent into the vaporizer, the amount of the solvent being sufficient such that an equilibrium between a vapor phase and a liquid phase of the solvent co-exist in the vaporizer.

2. The system of claim 1 wherein the method performed by the controller further comprises determining the amount of the introduced solvent based on previously gathered empirical data, and/or an input from an operator.

3. The system of claim 1 wherein the method performed by the controller further comprises monitoring a liquid content of the solvent in the vaporizer.

4. The system of claim 1 wherein the method performed by the controller further comprises maintaining the equilibrium in the vaporizer for a period of time.

5. The system of claim 1 wherein the method performed by the controller further comprises heating the vaporizer at a first end spaced apart from the injector and cooling the vaporizer at a second end proximate to the injector.

6. The system of claim 1 wherein the method performed by the controller further comprises purging the introduced solvent from the vaporizer and introducing additional solvent into the vaporizer.

7. The system of claim 1 wherein the method performed by the controller further comprises:
    opening the precursor supply valve to supply the precursor to the injector;
    periodically injecting the precursor into the vaporizer through the injector; and
    vaporizing the precursor in the vaporizer and opening the chamber inlet valve to supply the vaporized precursor to the reaction chamber.

8. The system of claim 1, wherein the method performed by the controller further comprises:
    partially vaporizing the introduced solvent in the vaporizer into a vapor phase and a liquid phase, the vapor phase being proximate to the injector and the liquid phase being spaced apart from the injector;
    contacting the solvent in the vapor phase with the injector; and
    removing contaminants from the injector to the solvent in the vapor phase.

9. The system of claim 8, wherein the method performed by the controller further comprises maintaining the vapor phase and the liquid phase of the solvent for a period of time.

10. The system of claim 8, wherein the method performed by the controller further comprises exposing at least a portion of the injector to a circulating precursor flow and condensing the solvent in the vapor phase after contacting the injector.

11. The system of claim 8, further comprising a heater, and wherein the method performed by the controller further comprises supplying heat via the heater to the vaporizer and continually vaporizing the solvent in the liquid phase with the supplied heat.

12. The system of claim 8, wherein the method performed by the controller further comprises monitoring a liquid content of the introduced solvent and ensuring at least a portion of the introduced solvent remains in the liquid phase.

* * * * *